United States Patent [19]
Yamamoto et al.

[11] Patent Number: 5,016,042
[45] Date of Patent: May 14, 1991

[54] APPARATUS FOR RECORDING COLOR IMAGE USING MASK MEMBERS

[75] Inventors: Takemi Yamamoto; Ichiro Sasaki, both of Nagoya, Japan

[73] Assignee: Brother Kogyo Kabushiki Kaisha, Aichi, Japan

[21] Appl. No.: 302,608

[22] Filed: Jan. 27, 1989

[30] Foreign Application Priority Data

Jan. 29, 1988 [JP] Japan ................................ 63-20987

[51] Int. Cl.$^5$ ............................................ G03B 27/52
[52] U.S. Cl. ........................................ 355/27; 355/100
[58] Field of Search ...................... 355/27, 28, 100, 40, 355/244

[56] References Cited

U.S. PATENT DOCUMENTS 4,231,659 11/1980 Logan .............................. 355/132 X
4,537,490 8/1985 Stoudt .............................. 355/244 X
4,810,614 3/1989 Sangyoji et al. ................... 355/27 X Primary Examiner—Michael L. Gellner
Assistant Examiner—D. Rutledge
Attorney, Agent, or Firm—Oliff & Berridge

[57] ABSTRACT

An image recording apparatus records an image of an original on a photosensitive recording medium using a plurality of intermediate sheets. The image of the original includes a fine line image, such as character, symbol, and a half-tone image, such as picture. To form a latent image of the fine line image on the recording medium, a light sheilding image corresponding exactly to the fine line image is printed on one of the intermediate sheets while completely masking an area where the half-tone image exists. On the other hand, to form a latent image of the half-tone image of a particular color, a light shielding image corresponding to the half-tone image of such a color is printed on another intermediate sheet, and another light sheilding image is printed thereon with a thicker line than the original fine line image. Accordingly, toner powder or ink needed for producing the intermediate sheets can be saved and thus cost for producing the same is reduced.

4 Claims, 5 Drawing Sheets

APPARATUS FOR RECORDING COLOR IMAGE USING MASK MEMBERS

BACKGROUND OF THE INVENTION

The present invention relates to an image recording apparatus for recording an image on a recording medium using intermediate image sheets each carrying a light shielding image on a light transmissive sheet (hereinafter referred to as "mask members"). More particularly, the invention relates to an image recording apparatus in which the mask member is interposed between a light source and a positive type photosensitive recording medium and light from the light source is irradiated onto the recording medium through the mask member to form thereon a latent image corresponding to the light shielding image of the mask member.

There is a co-pending U.S. patent application Ser. No. 07/175,392 filed by Masashi UEDA et al on Mar. 30, 1988, in which disclosed is an image recording method upon which the present invention is based. In the co-pending application, it is proposed that a color image and a monochromatic image (black image on white background) both provided on an original are recorded on a recording medium so that color displacement of the monochromatic image is obviated. More specifically, as shown in FIGS. 5A through 5D, four mask members 330R, 330G, 330B and 330L are used to record black character images (ABCDEFGH) together with color images as shown in FIG. 5E. In FIGS. 5A through 5D, those designated by 330R, 330G and 330B are half-tope mask members used for reproducing a half-tone image and the one designated by 330L is a fine line mask member used for reproducing fine line images. The half-tone image is reproduced according to a gradation reproducing method, but such a method is not employed when reproducing the fine line image.

Three kinds of half-tone mask members 330R, 330G and 330B are needed, since the image on a half-tone area is recorded by way of color resolution. Light of a wavelength causing to reproduce red color is irradiated onto the recording medium through the mask member 330R. Similarly, lights of wavelengths causing to reproduce green and blue colors are successively irradiated thereonto through the mask members 330G and 330B, respectively. By such a multiplexed exposure, the full-color image is reproduced according to a quasi-gradation method. On the other hand, in order to reproduce the fine line image, the fine line mask member 330L is used in which the half-tone area is wholly masked to prevent light from reaching the recording medium and the lights corresponding to red, green and blue are successively or simultaneously irradiated onto the fine line area to thus expose the recording medium to light through the mask member 330L. By the exposure performed in such a way, a highly resolutive monochromatic image is reproduced without incurring color displacement in the fine line image.

However, the fine line mask member 330L includes a light shielding area covering entirely the half-tone area, while each of the half-tone mask members includes a light shielding area covering entirely the fine line area. Therefore, in the case of reproducing an original in which the fine line area occupies a larger part, a large amount of light shielding material is required to shield the fine line area. When the four mask members are produced by an electrophotographic printer or an ink jet printer, a large amount of toner or ink is used and thus cost for producing one sheet of the mask member becomes costly.

SUMMARY OF THE INVENTION

The present invention has been made to eliminate the above-mentioned drawbacks and accordingly it is an object of this invention to reduce the cost of production of a mask member having a light shielding image on a light transmissive sheet.

In order to achieve the above and other objects, there is provided an image recording apparatus for recording an image of an original on a photosensitive recording medium using at least two intermediate sheets, said image of said original containing a first image and a second image, said first image being located in a first region of said original and said second image being located in a second region of said original, said apparatus comprising:

means for printing a first light shielding image on at least one of said intermediate sheets and a second light shielding image thereon, said first light shielding image corresponding to said first image and being printed to overly cover said first image and said second light shielding image being printed to at least partially cover said second image;

a light source unit for irradiating light through said intermediate sheets onto said photosensitive recording medium to form a latent image corresponding to said image of said original; and a developing unit for developing the latent image and providing a visible image.

DETAILED DESCRIPTION OF THE PREFERRED EMBODIMENTS

The present invention will be described with reference to the accompanying drawings.

Figure 1:
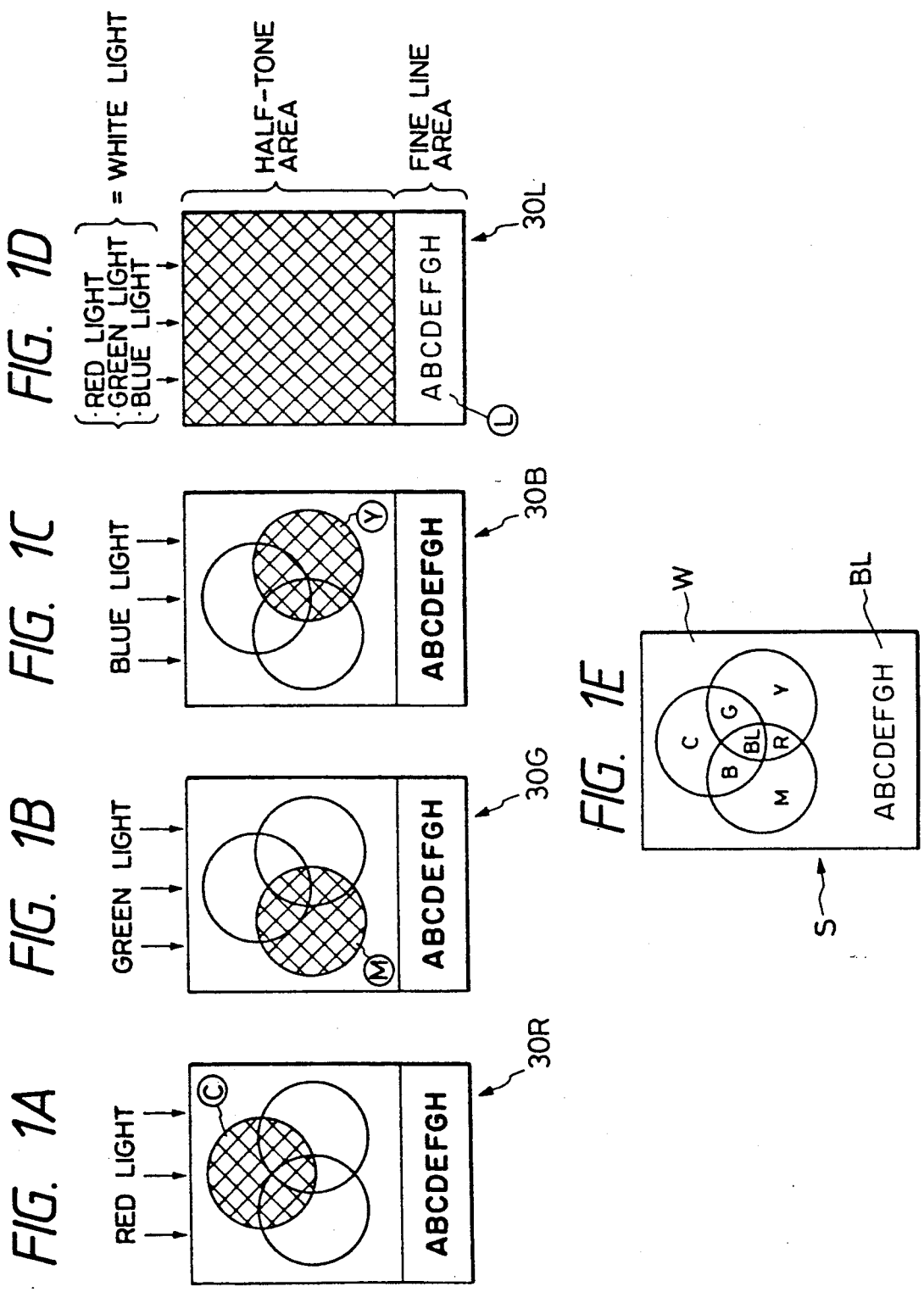
FIGS. 1A through 1E are explanatory diagrams for description of a principle for obtaining a color image on a recording sheet according to the present invention.

FIGS. 1A through 1E are explanatory diagrams corresponding respectively to FIGS. 5A through 5E, showing four mask members and a finally reproduced color image. FIGS. 1A through 1C show red, green and blue half-tone mask members 30R, 30G and 30B, respectively. FIG. 1D shows a fine line mask member 30L. In the half-tone area of each of the mask members 30R, 30G and 30B, red, green and blue color portions are respectively masked according to a quasi-gradation method, and in the fine line area thereof, light shielding images on the fine line mask member 30L are similarly printed but with a thicker line. In the mask member 30L, the half-tone area is completely masked and the fine line area has the light shielding images recorded according to a binary expression method. The cross-hatched portions and the characters (ABCDEFGH) on the respective mask members are masked with a light shielding material, such as a black-color toner. FIG. 1E shows a reproduced image having a full-color half-tone image and binary-expressed monochromatic fine line images. The image shown in FIG. 1E is obtained by exposing a photosensitive pressure-sensitive recording medium to light through the respective mask members to form a latent image thereon and then developing the same under pressure to provide a visual image.

The recording medium as used in the present invention is disclosed in U.S. Pat. No. 4,440,846 or 4,399,209. The former U.S. Patent discloses a self-contained type recording medium and the latter U.S. Patent discloses a transfer type recording medium. In the self-contained type, an encapsulated chromogenic material or dye precursor and a developer material are co-deposited on one surface of a single substrate as one layer or as two contiguous layers. In the transfer type, the developer material is coated on a separate substrate as a separate developer sheet. Both the self-contained type and the transfer type are sensitive to light and pressure.

As shown in FIGS. 4A through 4E, such a photosensitive pressure-sensitive recording medium has a substrate on which three kinds of pressure rupturable microcapsules are dispersely deposited. Cyan (C), magenta (M) and yellow (Y) chromogenic materials or dye precursors are separately encapsulated in the microcapsules together with a photo-curing or photo-softening material. The three kinds of the microcapsules are different in photo-sensitivity depending upon the wavelength of light. For example, the microcapsules containing cyan, magenta and yellow chromogenic materials are photo-cured or photo-softened in response to the wavelengths of 650 nm, 550 nm, 450 nm, respectively. By exposing the recording medium to the lights of such wavelengths, a latent image is formed thereon. The recording medium is then subjected to pressure development to rupture the microcapsules which have not photo-cured or remained softened and to react the chromogenic materials released from the ruptured microcapsules with a developer material, whereby a visible image is provided on the same recording medium or a separate developer sheet.

Referring back to FIGS. 1A through 1E, the cross-hatched circular portion (which portion is to be reproduced in cyan-color) is mesh-masked according to the quasi-gradation method. A mesh density is determined depending upon a coloring density as required. The light shielding images in the lower fine line area correspond to those of the fine line mask member 30L but the thickness of the light shielding image in the mask member 30R is made to be slightly thicker than those of the mask member 30L. The photosensitive pressure-sensitive recording medium S (photo-curing type) is exposed to light having a wavelength which photo-cures the cyan microcapsules through the red-color mask member 30R. As a result, the cyan microcapsules not masked by the mask member 30R are photo-cured while remaining the cyan microcapsules beneath the masking area are not photocured.

Similarly, as shown in FIGS. 1B and 1C, the green-color and blue-color mask members 30G and 30B have mesh-masking areas indicated by cross-hatchings (which areas are to be reproduced in magenta-color and yellow-color, respectively). Each of the mask members 30G and 30B has fine line images (ABCDEFGH) as in the mask member 30R. Those masking areas are also formed according to the quasi-gradation method and the fine line images are printed according to the binary expression method. By successively exposing the recording medium S to the green and blue lights, latent images of cyan, magenta and yellow colors are formed on the recording medium S. At this stage, however, the microcapsules masked by the light shielding images in each of the half-tone mask members are not photo-cured, since light is not applied thereto.

Next, when the red, green and blue lights are simultaneously or successively applied through the mask member 30L to the recording medium S, the microcapsules in the half-tone area are not further photo-cured but the microcapsules no longer masked by the thinner light shielding images are photo-cured and only the microcapsules still masked by the light shielding images on the mask member 30L remain unphotocured.

After exposure, the recording sheet S subjected to pressure development to rupture the uncured microcapsules and react the chromogenic materials released from the ruptured microcapsules with the developing material. As a result, the half-tone color image and the binary expressed fine line image are obtained in a single sheet as shown in FIG. 1E. In FIG. 1E, characters C, M, Y, R, G, B, W and BL denote respectively colors of cyan, magenta, yellow, red, green, blue, white and black. It is to be noted that the half-tone areas represented in FIGS. 1A through 1C need not be masked at the same mesh density but each of them may be masked at a desired mesh density depending upon the wanted coloring density of each of the colors. Further, the hue in the background of the fine line image can be made other than black color. For example, if the exposure to the fine line area is taken place with only red and green color lights, the background could be colored in yellow.

Figure 2:
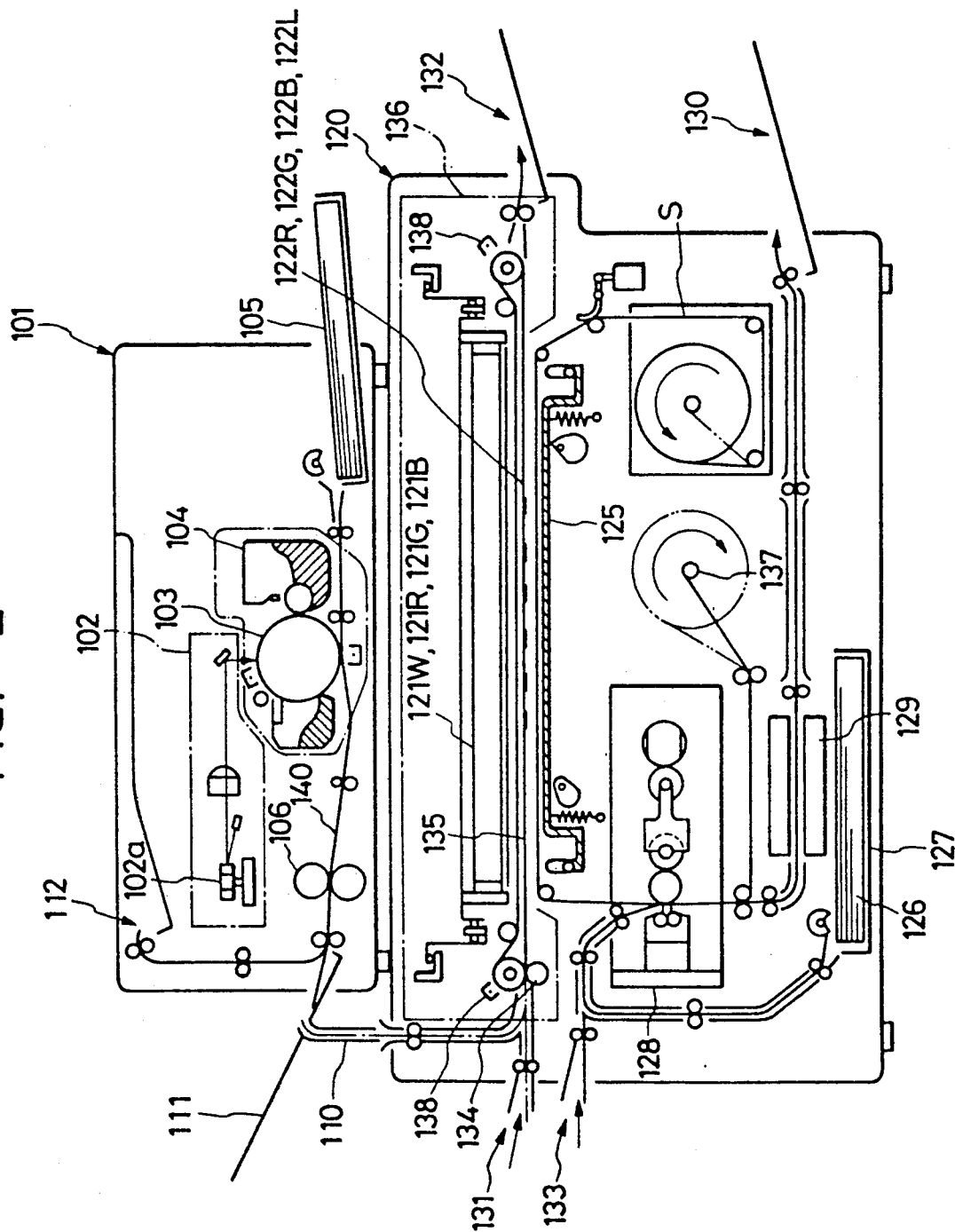
FIG. 2 is a vertical cross-sectional view showing an image recording apparatus used in the present invention.

FIG. 2 is a vertical cross-sectional view showing an image recording apparatus according to one embodiment of the present invention. The recording apparatus in FIG. 2 includes a monochromatic laser printer 101 in which a scanner unit 102 is provided. The scanner unit 102 includes a multi-face polygon scanner 102a rotatably provided for directing a laser light onto a photosensitive drum 103. The drum 103 has been previously charged to a predetermined polarity and when the laser light is irradiated thereonto, an electrostatic latent image is formed thereon. The latent image on the drum 103 is developed by toner powders contained in a toner reservoir 104, and the thus developed toner image is transferred onto an ordinary paper or a transparent sheet 140a for use, for example, in an overhead projector a which is fed from a sheet cassette 105. The toner image transferred onto the paper or sheet is then fixed by a fixing unit 106. Normally, the monochromatic laser printer 101 records data transmitted from a host computer (not shown). A color image recording apparatus 120 is disposed beneath the laser printer 101 and records an image using the mask members produced in accordance with the color picture data. In the apparatus shown in FIG. 2, when a monochromatic image output is needed, such a copy is produced by the monochromatic laser printer 101 and is discharged onto a tray 111 or 112.

The color recording apparatus 120 includes a paper guide unit 110 which guides the half-tone mask members 30R, 30G and 30B and a fine line mask member 30L to be fed into an exposure unit 136. An exposure stand 125 is disposed beneath the exposure unit 136, which brings the mask member to facial contact with a photosensitive pressure-sensitive recording medium S. In the exposure unit 136, light sources 121R, 121G, 121B and 121W are arranged in a direction perpendicular to the sheet of drawing for emitting three primary color lights of red, green and blue and white light, respectively. In the drawing, only one light source is illustrated for the sake of simplicity. The recording medium S is sequentially exposed to light from each of the light sources through the associated mask member, and is then fed into a developing unit 128. A sheet cassette 127 is provided in the bottom portion of the apparatus for accommodating a stack of developer sheets 126. One surface of the developer sheet 126 is coated with a developer material which reacts with a chromogenic material encapsulated in a microcapsule on the surface of the recording medium S. The developer sheet 126 and the recording medium S are fed into the pressure developing unit 128 while being held in facial contact with each other, in which the microcapsules which remain uncured are ruptured and an image is developed on the developer sheet 126. After passing through the developing unit 128, the exhausted recording medium a microcapsule sheet S is wound around a take-up roller 137 and the developer sheet 126 is fed into a heat fixing unit 129 for accelerating the fixing of the developed image. A discharge tray 130 is provided for receiving the output copy sheet. An insertion tray 131 is optionally provided for allowing the mask members to be inserted therefrom. The mask members are discharged onto a discharge tray 132. An insertion tray 133 is also optionally provided for allowing a developer sheet to be inserted therefrom.

Figure 3:
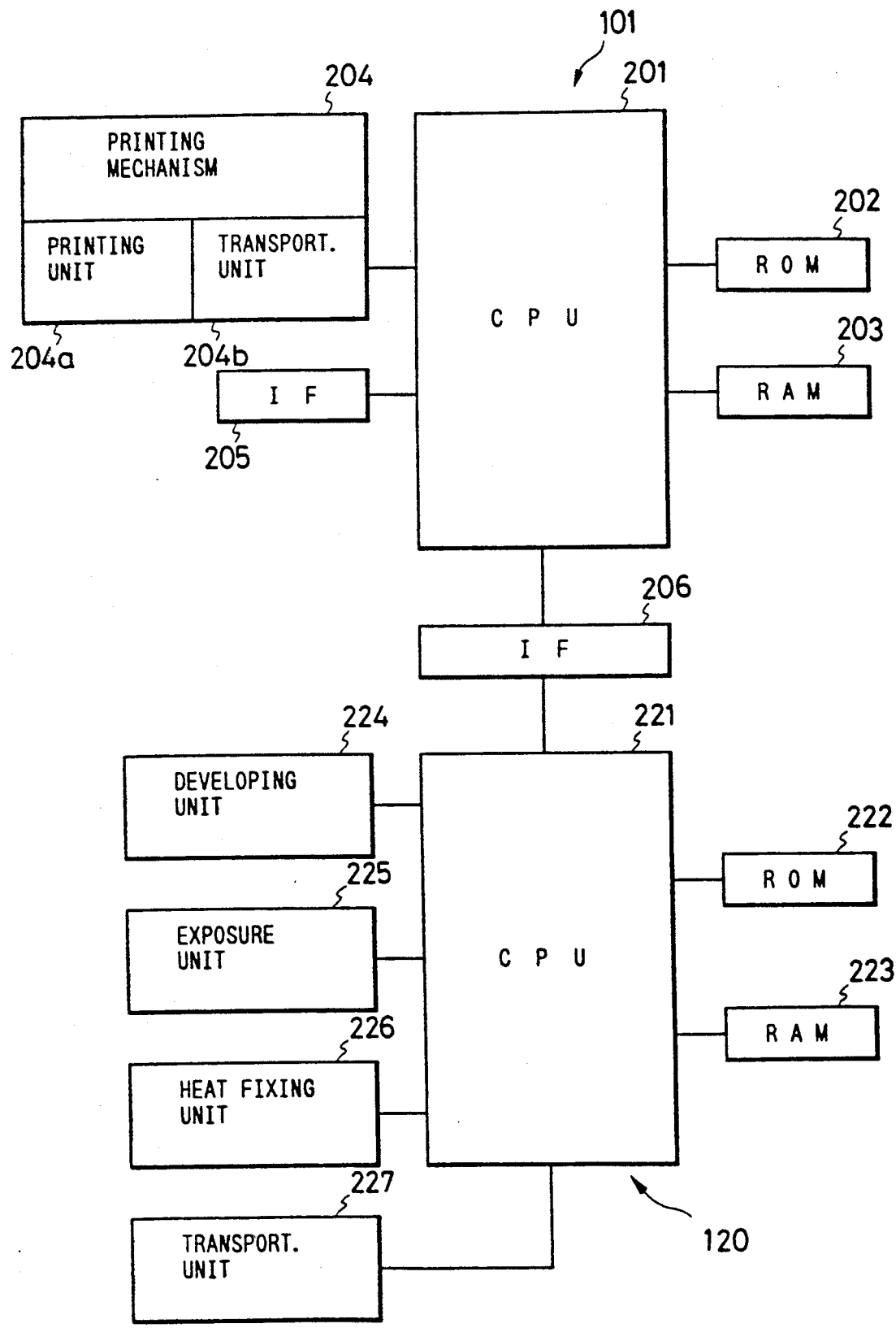
FIG. 3 is a block diagram showing a control section provided interiorly of the image recording apparatus shown in FIG. 2.
Figure 4A:
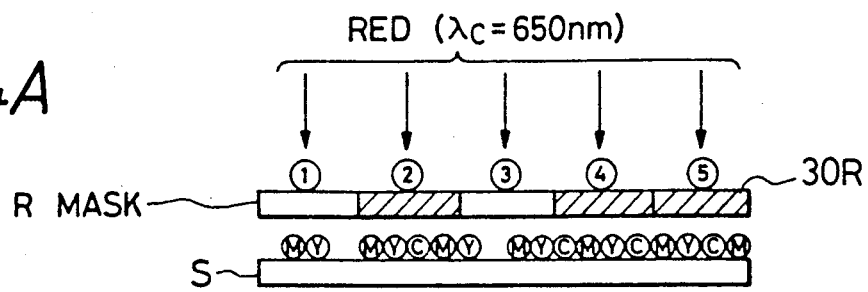
FIGS. 4A through 4E are explanatory diagrams illustrating a principle for obtaining a color image on a photosensitive recording medium with the use of a mask member.
Figure 4B:
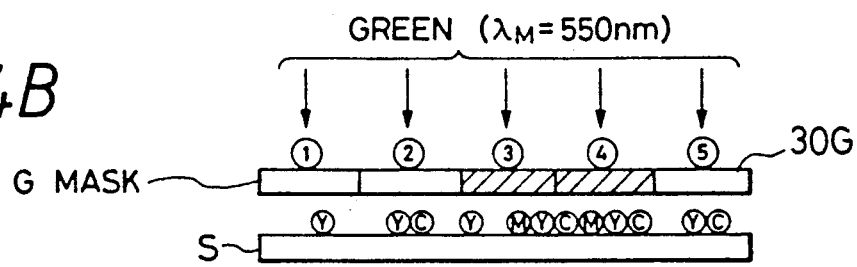
Figure 4C:
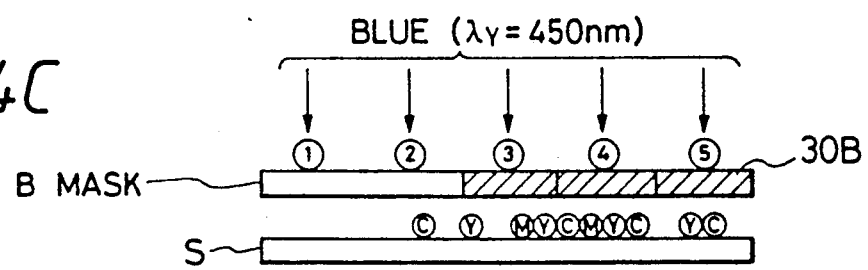
Figure 4D:
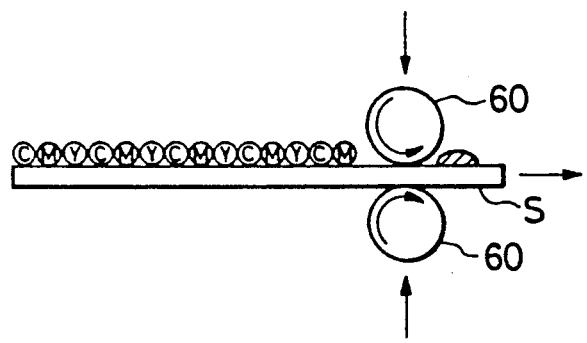
Figure 4E:
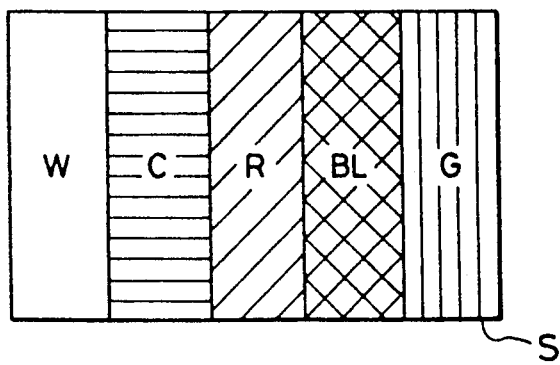
Figure 5D:
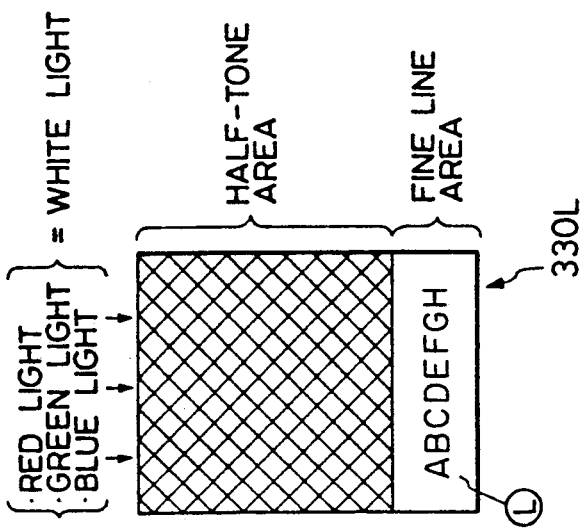
FIGS. 5A through 5E are explanatory diagram for description of a principle for obtaining a color image on a recording sheet according to a method proposed in a copending application.
Figure 5C:
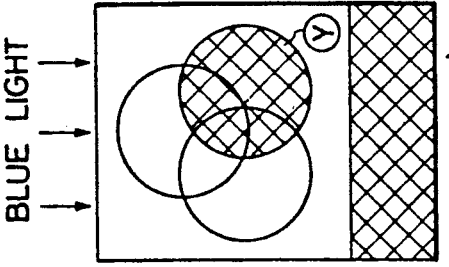
Figure 5B:
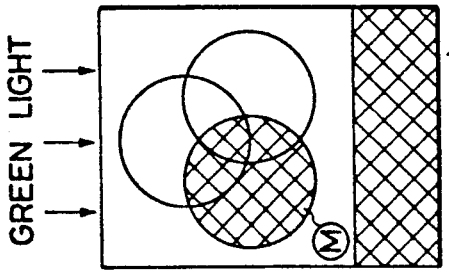
Figure 5A:
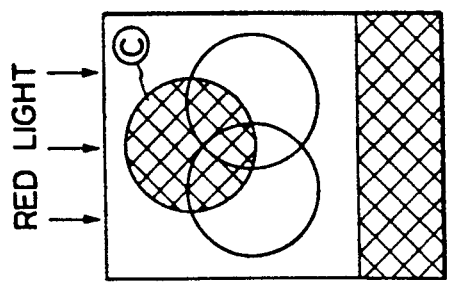
Figure 5E:
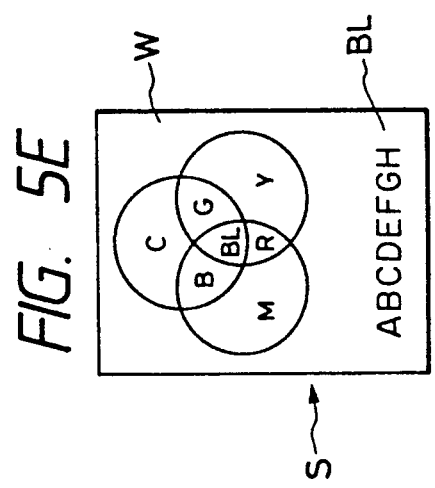

Next, an electronic circuit provided interiorly of the apparatus will be described with reference to FIG. 3. The monochromatic laser printer 101 includes a central processing unit (CPU) 201 for controlling the operation of the printer. Connected to the CPU 201 are a read-only memory (ROM) 202, a random access memory (RAM) 203, a printing mechanism 204 and an interface (IF) 205. The ROM 202 stores a program for operating the CPU 201 and character data representative of characters and symbols. The RAM 203 functions as a work memory and stores image data therein. The printing mechanism 204 is provided with a printing unit 204a and a transporting unit 204b. The printing unit 204a includes the polygon scanner 102, the photosensitive drum 103, the developing unit 104 and the fixing unit 106. The transporting unit 204b serves to supply and transport the sheet 140 from the sheet cassette 105. The interface 205 is provided for connecting a host computer (not shown) to the CPU 201.

The color image recording apparatus 120 includes a central processing unit (CPU) 221 for controlling the apparatus 120. Connected to the CPU 221 are a ROM 222, a RAM 223, a pressure developing unit 224, an exposure unit 225, a heat fixing unit 226, a transporting unit 227, and an interface 206. A program is stored in the ROM 222 for operating the CPU 221. The RAM 223 serves as a work memory. The pressure developing unit 224 controls the driving of the pressure developing roller 128. The exposure unit 225 controls the light sources 121R, 121G, 121B and 121W to be selectively lit. The heat fixing unit 226 controls the heat fixing unit 129. The transporting unit 227 controls the transportations of the recording medium or microcapsule sheet S, the developer sheet 126 and the mask members 30R, 30G, 30B and 30L. The CPU 221 is coupled through the interface 206 to the CPU 201 to allow the data exchange to be carried out therebetween.

The data transmitted from the host computer is stored in the RAM 203 through the interface 205 under the aegis of the CPU 201. The data stored in the RAM 203 is expanded to pattern data while referring to font data stored in the RAM 203 and the resultant data is again stored in the RAM 203. It should be noted that if the data transmitted from the host computer is the pattern data, data expansion needs not be implemented. The CPU 201 causes the RAM 203 to store one-page pattern data and then detects color data, character data and image data, whereupon one-page pattern data is separated. In the case of producing a fine line mask member (30L), the CPU 201 produces data causing to adhere toner powders to the portions where the image data is present and to provide a light shielding image corresponding to the character data. The data thus produced by the CPU 201 is stored in the RAM 203. The CPU 201 controls the printing mechanism 204 so that the masking area and the light shielding image are formed in accordance with the data stored in the RAM 203 (see FIG. 1D).

In the case of producing a half-tone mask member, the CPU 201 shifts the character data in both the lateral and vertical directions to thereby produce shift data and the latter data is ANDed with the character data to provide thickened character data which corresponds to the character data but the line of the character or the symbol is made thicker than the line of the actual character or the symbol. The thickened character data is then stored in the RAM 203. Further, the CPU 201 detects data representative of the color of the image and produces data causing to produce each of the half-tone mask members. The data thus produced by the CPU 201 is also stored in the RAM 203. The CPU 201 controls the printing mechanism 204 so that the light shielding image is formed in accordance with the data stored in the RAM 203 (see FIGS. 1A through 1C).

As described, the CPU 201 serves as a forming means for forming a light shielding image corresponding to an image to be reproduced in which the line of the light shielding image is thicker than the line of the actual image. The CPU 201 further serves as a discriminating means for discriminating the character data from the image data.

When forming the half-tone masking image on the half-tone mask member, the CPU 201 produces the image data causing to form the masking image of the same size as the actual image. When forming the fine line image on the half-tone mask member, the CPU 201 produces the fine line image data causing to form the fine line image corresponding to the actual fine line image but with a thicker line.

Next, a color mode image reproducing operation will be described. The mask member 30R produced by the laser printer 101 according to the quasi-gradation method passes through a guide unit 110. By means of a roller 134 for registration of the position of the mask member 30R, the top edge of the mask member 30R is placed in a predetermined position. An endless conveyor belt 135 is electrostatically charged to a certain polarity by means of an electrostatic unit 138, such as corotron, and the mask member 30R is electrostatically attached thereto. The conveyor belt 135 is made of an insulating material, such as polyethylene terephthalate (PET). The mask member 30R is conveyed by the conveyor belt 135 to an exposure unit 136. In the exposure unit 136, the position of the mask member 122R is adjusted by moving the conveyor belt 135 so that the colors of the latent images formed on the recording medium S are not displaced from one another. The mask member 30R and the recording medium S are held in facial contact with each other and are exposed to light from the light source 121R, whereby a latent image correspsonding to the mask member 30R is formed on the recording medium S. After this exposure is taken place, the mask member 30R is discharged onto the tray 132. The same operation is performed for the mask members 30G and 30B. As a result, latent images of the respective color images are formed on the recording medium S in multiplexed manner.

Thereafter, the mask member 30L for the fine line image is conveyed into the exposure unit 136 in the similar fashion as is done for the mask member 30R. After the mask member 30L is accurately positioned on the recording medium S, the mask member 30L is brought to intimate contact with the recording medium S. After being exposed to lights from the light sources 121R, 121G and 121B in multiplexed manner, the mask member 30L is discharged onto the tray 132. The recording medium S thus exposed is brought to facial contact with the developer sheet 126 and a pressure development is carried out in the pressure developing unit 128, whereby a visible color image is produced on the developer sheet. The developer sheet 126 is thereafter sent to the heat fixing unit 129 and then discharged onto the tray 130. The used recording medium S is wound around the take-up roller 137.

While description has been made with reference to the case where the monochromatic laser printer is used, another type of printers, such as an LED printer, liquid crystal printer, heat transfer printer, are available insofar as those are capable of producing three chromatic mask members of red, green and blue colors. Furthermore, the present invention is not limited to such apparatus using the photosensitive pressure-sensitive recording medium but is applicable to a thermal developing method using a silver salt or silver halide photographic material while using the exposure method as described.

As is apparent from the foregoing description, the recording apparatus according to the present invention is capable of recording a full-color image containing both a fine line image and a half-tone color image. In the invention, the image is recorded with the use of a plurality of mask members including a fine line mask member and half-tone mask members. In the half-tone mask member, the fine line area is not completely masked but the fine line images are masked in slightly enlarged manner yet covering the fine line images. Therefore, toner powder or ink needed for producing the mask members can be saved and thus the cost for producing the mask member is significantly reduced.

What is claimed is:

1. An image recording apparatus for recording an image of an original on a photosensitive recording medium using at least two intermediate sheets, said image of said original containing a first image and a second image, said first image being located in a first region of said original and said second image being located in a second region of said original, said apparatus comprising:

means for printing a first light shielding image and a second light shielding image simultaneously on at least one of said intermediate sheets, said first light shielding image being printed to have an outline profile corresponding to and larger than that of said first image and said second light shielding image being printed to at least partially cover said second image;

a light source unit for irradiating light through said intermediate sheets onto said photosensitive recording medium to form a latent image corresponding to said image of said original; and a developing unit for developing said latent image and providing a visible image.

2. An image recording apparatus according to claim 1, wherein said printing means further prints a third light shielding image and a fourth light shielding image simultaneously on another one of said intermediate sheets, said third light shielding image being in coincidence with said first image and said fourth light shielding image being printed to wholly cover said second region.

3. An image recording apparatus according to claim 2, wherein said printing means comprises a discriminating means for discriminating between said first image and said second image and providing a first signal when said first image is discriminated and a second signal when said second image is discriminated, wherein said first and said second light shielding images are printed when said first signal is provided from said discriminating means and said third and said fourth light shielding images are printed when said second signal is provided therefrom.

4. An image recording apparatus according to claim 3, wherein said photosensitive recording medium has a first material and a second material, said first material being changed from a first phase to a second phase when exposed to light, wherein said first material comprises a photosensitive material and a chromogenic material selected from the colors comprising cyan, magenta and yellow, and said second material comprises a developer material, said photosensitive material and said chromogenic material being encapsulated in a pressure rupturable microcapsule and a mechanical strength of said microcapsule being different between said first phase and said second phase.

* * * * *